United States Patent
Kengoyama et al.

(10) Patent No.: US 12,417,911 B2
(45) Date of Patent: Sep. 16, 2025

(54) METHOD AND SYSTEM FOR FORMING SILICON NITRIDE LAYER USING LOW RADIO FREQUENCY PLASMA PROCESS

(71) Applicant: ASM IP Holding B.V., Almere (NL)

(72) Inventors: Yuko Kengoyama, Kawasaki (JP); Makoto Igarashi, Fuchu (JP)

(73) Assignee: ASM IP Holding B.V., Almere (NL)

( * ) Notice: Subject to any disclaimer, the term of this patent is extended or adjusted under 35 U.S.C. 154(b) by 749 days.

(21) Appl. No.: 17/705,158

(22) Filed: Mar. 25, 2022

(65) Prior Publication Data

US 2022/0319831 A1 Oct. 6, 2022

Related U.S. Application Data

(60) Provisional application No. 63/167,775, filed on Mar. 30, 2021.

(51) Int. Cl.
- *H01L 21/02* (2006.01)
- *C23C 16/34* (2006.01)
- *C23C 16/455* (2006.01)
- *H01J 37/32* (2006.01)

(52) U.S. Cl.
CPC ........ *H01L 21/0228* (2013.01); *C23C 16/345* (2013.01); *C23C 16/45553* (2013.01); *H01J 37/32082* (2013.01); *H01J 37/32449* (2013.01); *H01L 21/0217* (2013.01); *H01L 21/02274* (2013.01)

(58) Field of Classification Search
None
See application file for complete search history.

(56) References Cited

U.S. PATENT DOCUMENTS

| | | | |
|---|---|---|---|
| 8,334,219 B2 | 12/2012 | Lee | |
| 8,647,722 B2 | 2/2014 | Kobayashi | |
| 8,722,546 B2 | 5/2014 | Fukazawa | |
| 9,023,737 B2 | 5/2015 | Beynet | |
| 9,214,333 B1 * | 12/2015 | Sims | C23C 16/52 |
| 10,580,645 B2 | 3/2020 | Ueda | |
| 2020/0395209 A1 | 12/2020 | Yoshimoto | |
| 2021/0225643 A1 | 7/2021 | Kuroda | |

OTHER PUBLICATIONS

"Comparing low frequency (100 kHz) plasma systems to higher frequency (13.56 MHZ) plasma systems (company literature)". (Year: 2018).*

* cited by examiner

*Primary Examiner* — Asok K Sarkar
(74) *Attorney, Agent, or Firm* — Snell & Wilmer L.L.P.

(57) ABSTRACT

Methods of forming treated silicon nitride layers are disclosed. Exemplary methods include forming a silicon nitride layer overlying the substrate by providing a silicon precursor to the reaction chamber for a silicon precursor pulse period, providing a nitrogen reactant to the reaction chamber for a reactant pulse period, during a deposition process applying a first plasma power having a first frequency for a first plasma power period, and during a treatment step, applying a second plasma power having a second frequency for a second plasma power period.

20 Claims, 10 Drawing Sheets

| Process Step | Precursor Feed | Source Purge | RF ON (Deposition/wH2) | Treatment | Hydrogen Reactant | Post Treatment Purge |
|---|---|---|---|---|---|---|
| Silicon Precursor | 302 | | | | | |
| Nitrogen Reactant | | | 304 | | | |
| Hydrogen Reactant | | | 306 | | | 306' |
| HRF on | | | 308 | | | |
| LRF on | | | | 310 | | |

312 (Precursor Feed / Source Purge / RF ON)
314 (Treatment / Hydrogen Reactant / Post Treatment Purge)
300

FIG. 3

| Process Step | Feed | Source Purge | RF ON (Deposition) | Post-Deposition Purge | Hydrogen Reactant OFF | Treatment | Hydrogen Reactant IN |
|---|---|---|---|---|---|---|---|
| Silicon Precursor | 402 | | | | | | |
| Nitrogen Reactant | 404 | | | | | | |
| Hydrogen Reactant | 406 | | | | | | 406' |
| HRF on | | | 408 | | | | |
| LRF on | | | | | | 410 | |

← 412 ← 414 ← 416 ← 418

400

FIG. 4

METHOD AND SYSTEM FOR FORMING SILICON NITRIDE LAYER USING LOW RADIO FREQUENCY PLASMA PROCESS

CROSS-REFERENCE TO RELATED APPLICATIONS

This application claims the benefit of U.S. Provisional Application No. 63/167,775, filed on Mar. 30, 2021, in the United States Patent and Trademark Office, the disclosure of which is incorporated herein in its entirety by reference.

FIELD OF INVENTION

The present disclosure generally relates to methods and systems for forming structures suitable for forming electronic devices. More particularly, examples of the disclosure relate to methods and systems for forming layers comprising silicon nitride.

BACKGROUND OF THE DISCLOSURE

Silicon nitride layers can be used for a variety of purposes during the manufacture of electronic devices. For example, silicon nitride layers can be used as a liner, as a gap fill material, or the like.

In some cases, a plasma-enhanced process, such as plasma-enhanced ALD (PEALD), can be used to deposit silicon nitride. Plasma-enhanced processes can be operated at relatively low temperatures and/or exhibit relatively high deposition rates, compared to methods that do not employ a plasma.

In liner applications, uniform film quality along a sidewall of deposited silicon nitride is often desirable. Unfortunately, many plasma silicon nitride processes cannot produce silicon nitride layers with desired quality (e.g., etch rate) uniformity.

In gap fill applications, silicon nitride deposited using PEALD on high aspect-ratio features (e.g., gaps having an aspect ratio of three or more) tends to form voids in the deposited material, because less material is deposited at the bottom of a feature (e.g., on a bottom surface or on a side surface near the bottom of the gap—compared to a side surface of the gap at or near the top of the gap). The poor conformality and/or undesired deposition profile of the deposited silicon nitride can be attributed to a relatively low ion bombardment effect.

Efforts to improve low conformality and/or gap-fill ability of PEALD deposited silicon nitride have focused on tuning process parameters, such as plasma exposure time, pressure, and the like, so as to provide adequate activated species, such as radicals, near the bottom of a feature, so as to increase an amount of material deposited at the bottom of the feature. However, because recombination of radicals is an intrinsic phenomenon, such efforts have been limited.

To overcome such problems, several techniques have been proposed. For example, U.S. Pat. No. 9,887,082 to Pore et al. discloses a method for filling a gap. The method includes providing a precursor into a reaction chamber to form adsorbed species on a surface of a substrate, exposing the adsorbed species to a nitrogen plasma to form species at the top of the feature that include nitrogen, and providing a reactant plasma to the reaction chamber, wherein nitrogen acts as an inhibitor to the reactant, resulting in less material being deposited at the top of the gap, compared to traditional PEALD techniques. Such techniques can result layers with undesirably high wet etch rate variability.

Accordingly, improved methods of forming silicon nitride layers on a surface of a substrate are desired. Further, device structures, which include the silicon nitride layers, are also desired. And, systems for performing the method are also desired.

Any discussion of problems and solutions set forth in this section has been included in this disclosure solely for the purpose of providing a context for the present disclosure, and should not be taken as an admission that any or all of the discussion was known at the time the invention was made.

SUMMARY OF THE DISCLOSURE

Various embodiments of the present disclosure relate to methods of forming silicon nitride layers on a surface of a substrate and to systems for forming the silicon nitride layers. Methods described herein can be used in a variety of applications, including forming of silicon nitride liner layers and/or silicon nitride gap fill processes.

While the ways in which various embodiments of the present disclosure address drawbacks of prior methods and systems are discussed in more detail below, in general, various embodiments of the disclosure provide improved methods of forming silicon nitride layers with reduced variation in quality of the layer and/or with improved gap fill.

In accordance with examples of the disclosure, a method of forming a silicon nitride layer on a surface of a substrate includes providing the substrate within a reaction chamber, forming a layer of deposited silicon nitride overlying the substrate, and treating the layer of deposited silicon nitride layer using a treatment plasma. The step of forming the layer of deposited silicon nitride includes providing a silicon precursor to the reaction chamber for a silicon precursor pulse period, providing a nitrogen reactant to the reaction chamber for a nitrogen reactant pulse period, and applying a deposition plasma power having a first frequency for a first plasma power period to form excited species from the nitrogen reactant to form the layer of deposited silicon nitride. The step of treating the layer of deposited silicon nitride layer includes using a treatment plasma having a treatment plasma power and second frequency for a treatment plasma power period. In some cases, the first frequency and the second frequency can be about the same (e.g., about 300 kHz and about 500 kHz). In some cases, the first frequency is higher than the second frequency. For example, the first frequency can be between about 13 MHz and about 14 MHz or about 26 MHz and about 28 MHz, and the second frequency can be between about 300 kHz and about 500 kHz. The steps of forming the layer of deposited silicon nitride and treating the layer of deposited silicon nitride layer can be repeated to form the silicon nitride layer. In some cases, a hydrogen reactant can be provided to the reaction chamber—e.g., during the step of forming the layer of deposited silicon nitride. In such cases, the hydrogen reactant may not be provided to the reaction chamber during the step of treating the layer of deposited silicon nitride layer. In accordance with further examples of these embodiments, the first plasma power period and the second plasma power period do not overlap in time or in space. And, in accordance with further examples, the step of treating the layer of deposited silicon nitride layer includes using the treatment plasma power having the second frequency and a third frequency.

In accordance with further embodiments of the disclosure, a device structure is provided. The device structure can be formed according to a method as set forth herein. The device structure can include a substrate and one or silicon nitride layers as described herein.

In accordance with yet additional examples of the disclosure, a system configured to perform a method and/or form a device structure as described herein is provided.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIG. 3 illustrates a timing sequence of a method suitable for a gap fill process in accordance with examples of the disclosure.

FIG. 4 illustrates a timing sequence of a method suitable for forming a liner in accordance with examples of the disclosure.

Figure 5:
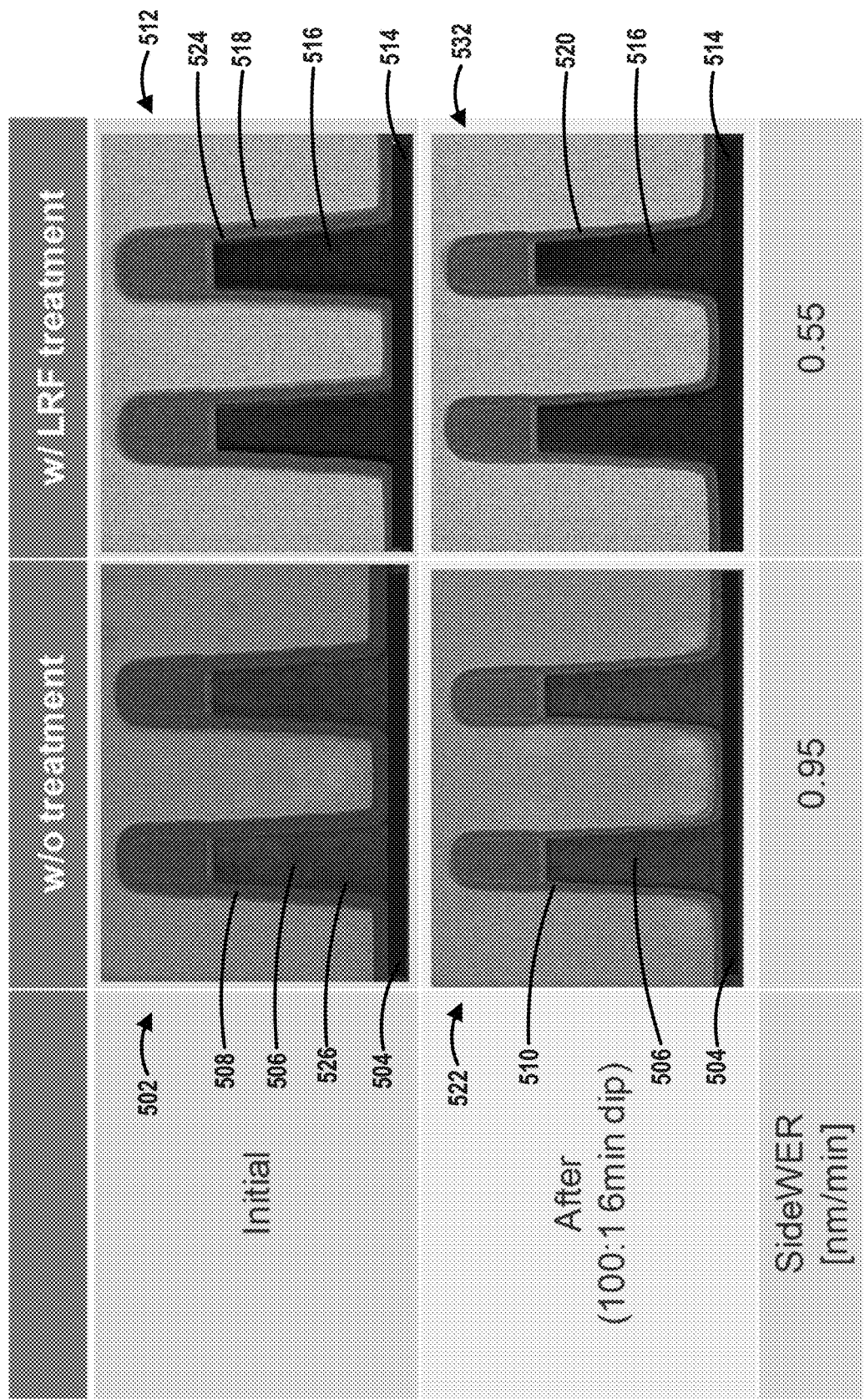

FIG. 5 illustrated STEM images of structures formed with and without low-frequency plasma treatment.

Figure 6:
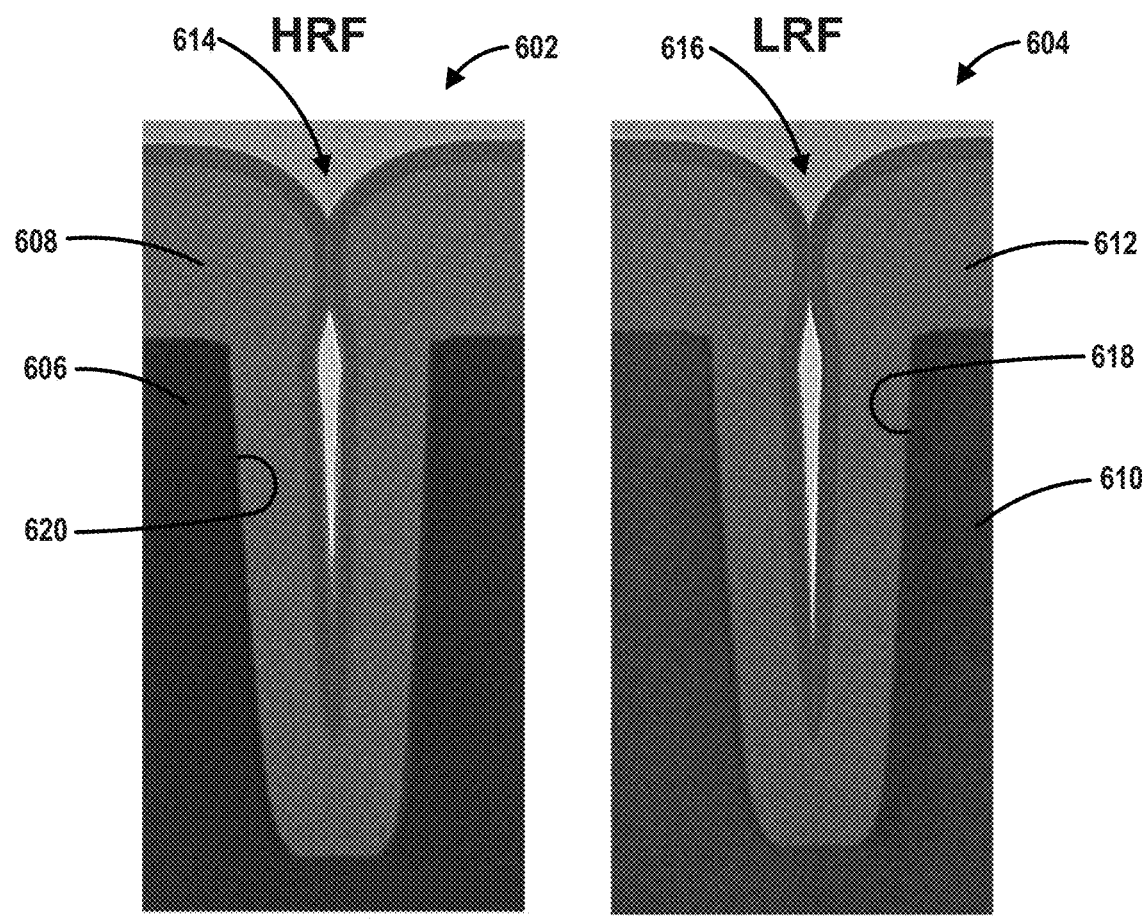

FIG. 6 illustrated STEM images of structures formed using high-frequency plasma treatment and using low-frequency plasma treatment.

Figure 7:
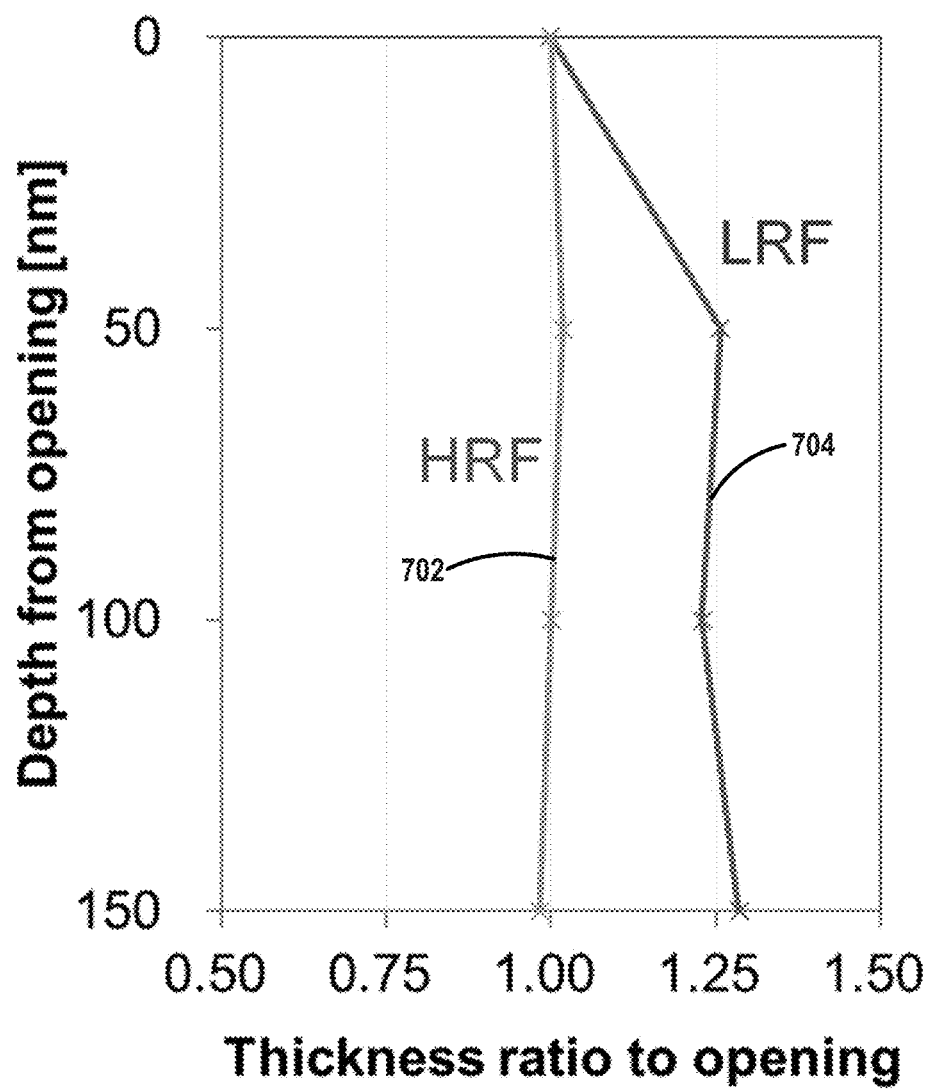

FIG. 7 illustrates thickness ratio verses depth for structures illustrated in FIG. 6.

Figure 8:
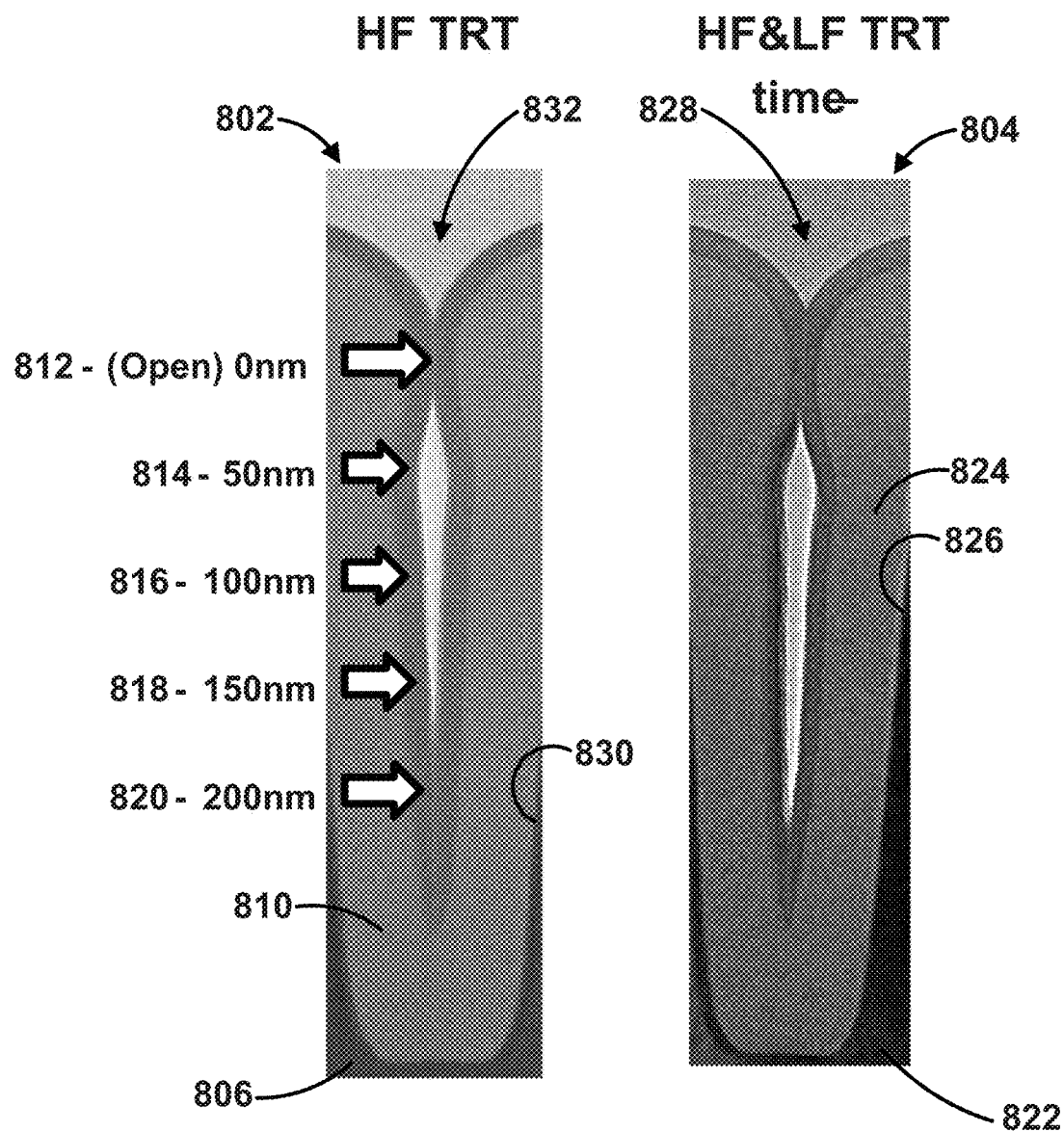

FIG. 8 illustrated STEM images of a structures formed using high-frequency plasma treatment and a structure formed using high frequency plus low-frequency plasma treatment.

Figure 9:
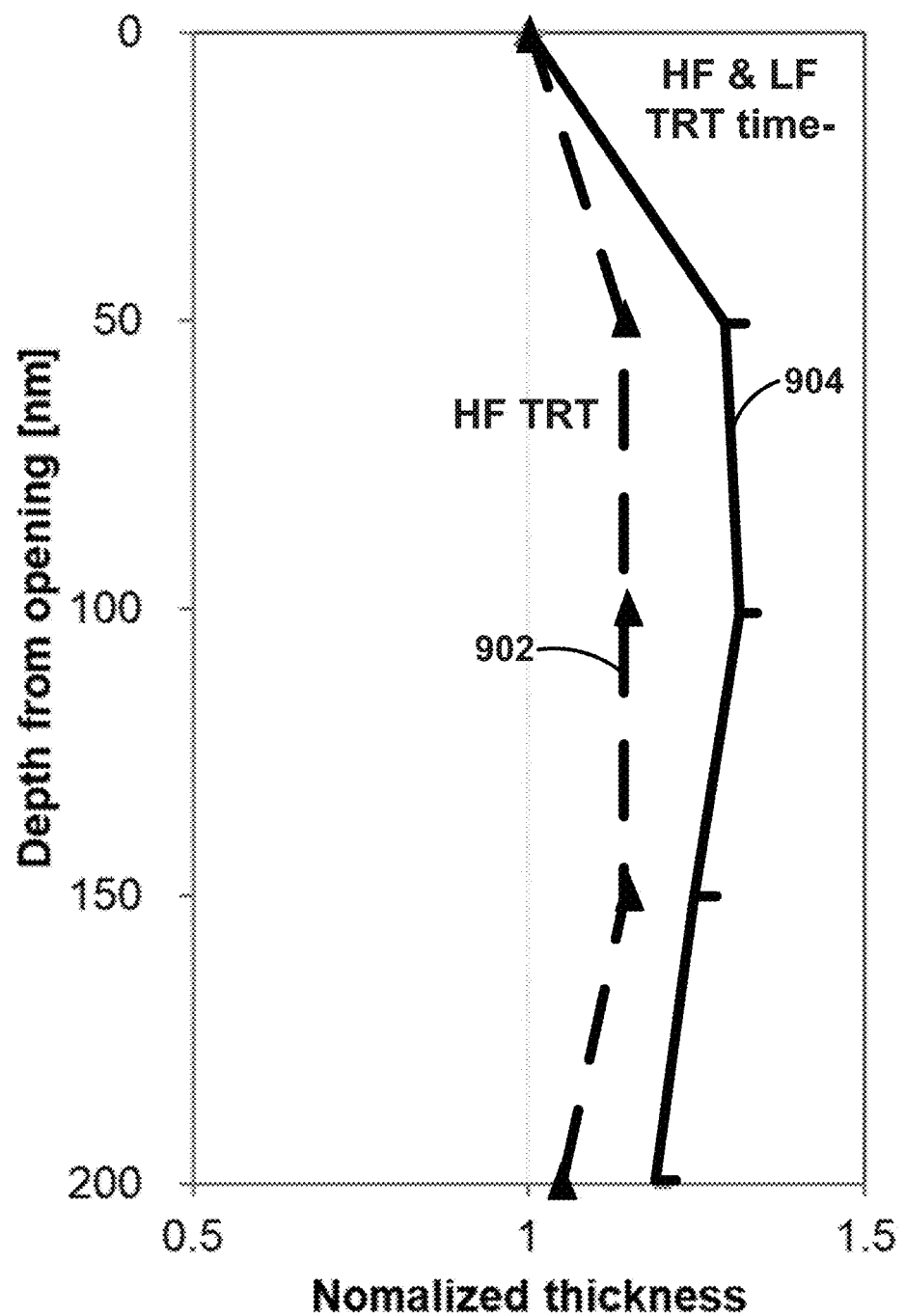

FIG. 9 illustrates normalized silicon nitride layer thickness verses depth for structures illustrated in FIG. 8.

Figure 10:
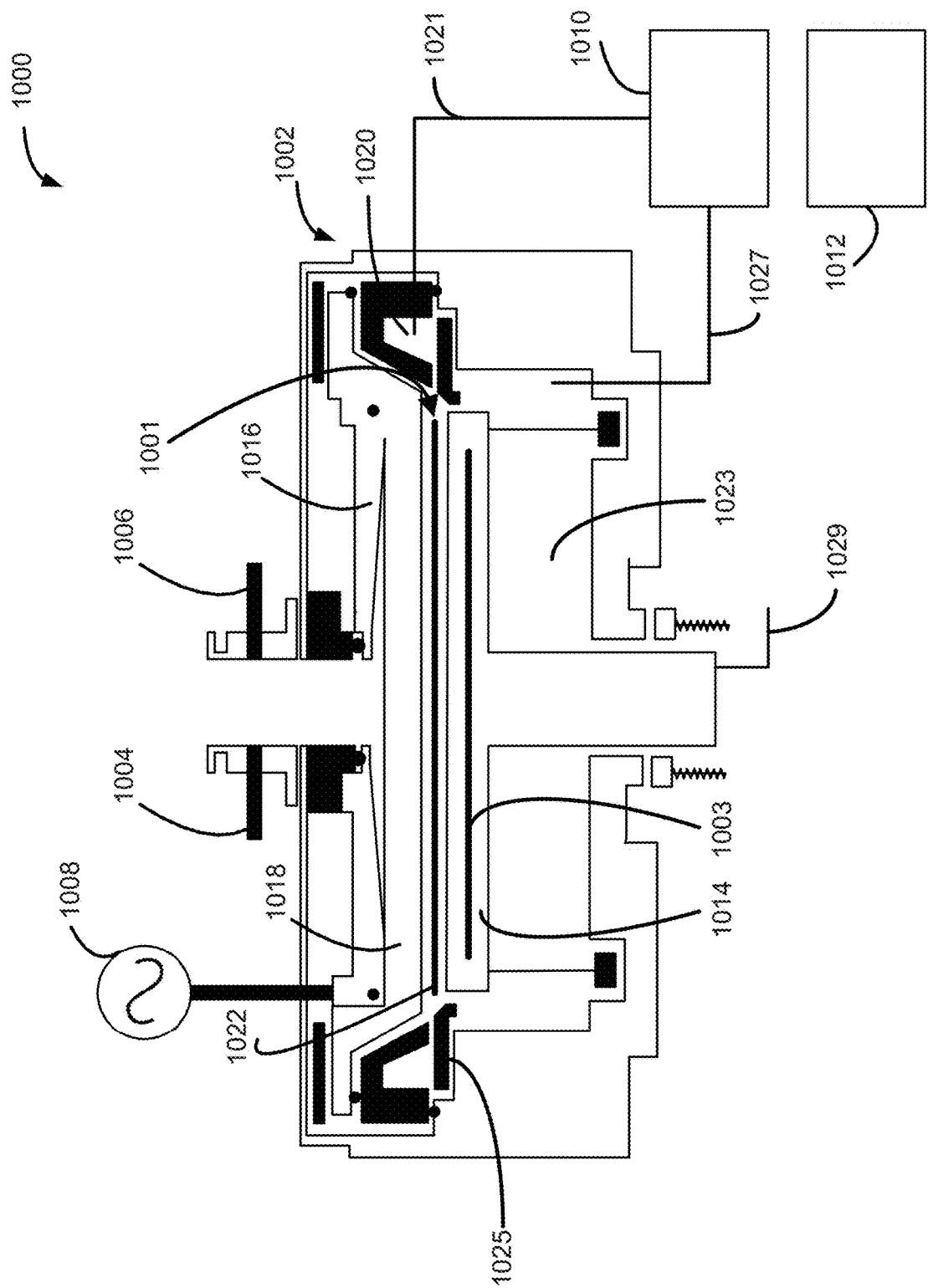

FIG. 10 illustrates a system in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming a silicon nitride layer on a surface of a substrate, to device structures including the silicon nitride layer, and to systems for performing the methods and/or forming the device structures. As described in more detail below, exemplary methods can be used to form device structures suitable for forming electronic devices. For example, exemplary methods can be used to form silicon nitride liners and/or to fill gaps or recesses on a surface of a substrate with silicon nitride.

In this disclosure, gas may include material that is a gas at normal temperature and pressure, a vaporized solid and/or a vaporized liquid, and may be constituted by a single gas or a mixture of gases, depending on the context. A gas other than the process gas, e.g., a gas introduced without passing through a gas distribution assembly, such as a showerhead, other gas distribution device, or the like, may be used for, e.g., sealing the reaction space, and may include a seal gas, such as a rare or other inert gas. The term inert gas refers to a gas that does not take part in a chemical reaction to an appreciable extent and/or a gas that can excite a precursor when plasma power is applied. The terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various features, such as recesses, lines, and the like formed within or on at least a portion of a layer of the substrate. By way of particular examples, a substrate can include features (e.g., protrusions, recess, or gaps) having an aspect ratio or 3 or more.

In some embodiments, film refers to a layer extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequences, and/or functions or purposes of the adjacent films or layers.

In this disclosure, continuously can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments. For example, a reactant can be supplied continuously during two or more steps and/or cycles of a method.

The term cyclic deposition process or cyclical deposition process can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

As used herein, the term atomic layer deposition (ALD) may refer to a vapor deposition process in which deposition cycles, preferably a plurality of consecutive or continuous deposition cycles, are conducted in a process chamber.

Typically, during each cycle, a precursor is introduced and may be chemisorbed to a deposition surface (e.g., a substrate surface or a previously deposited underlying surface, such as material from a previous ALD cycle), forming a monolayer or sub-monolayer that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor composition(s), reactive gas, and purge (e.g., inert carrier) gas. PEALD refers to an ALD process, in which a plasma is applied during one or more of the ALD steps.

As used herein, the term purge may refer to a procedure in which an inert or substantially inert gas is provided to a reactor chamber continuously or in between two pulses of gases which react with each other. For example, a purge may be provided between a precursor pulse and a reactant pulse, thus avoiding or at least minimizing gas phase interactions between the precursor and the reactant. It shall be understood that a purge can be effected either in time or in space, or both. For example, in the case of temporal purges, a purge step can be used, e.g., in the temporal sequence of providing a first precursor to a reactor chamber, providing a purge gas to the reactor chamber, and providing a second precursor or a reactant to the reactor chamber, wherein the substrate on which a layer is deposited does not move. In the case of spatial purges, a purge step can take the following form: moving a substrate from a first location to which a first precursor is supplied, through a purge gas curtain, to a second location to which a second precursor is supplied.

As used herein, silicon nitride refers to a material that includes silicon and nitrogen. Silicon nitride can be represented by the formula $Si_3N_4$. In some cases, the silicon nitride may not include stoichiometric silicon nitride. In some cases, the silicon nitride can include other elements, such as carbon, nitrogen, hydrogen, or the like.

As used herein, the term overlap can mean coinciding with respect to time and within a reaction chamber. For example, when two or more reactant pulse periods overlap, there is a period of time in which each or the two reactants is provided to or is present within a reaction chamber.

Further, in this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, or the like in some embodiments. Further, in this disclosure, the terms include, including, constituted by and having can refer independently to typically or broadly comprising, consisting essentially of, or consisting of in some embodiments. In this disclosure, any defined meanings do not necessarily exclude ordinary and customary meanings in some embodiments.

Figure 1A:
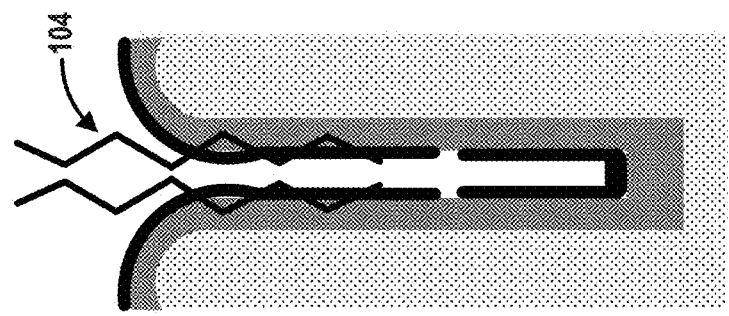
FIGS. 1A and 1B illustrate effects of species generated using (A) a high frequency power to form a plasma and (B) a low frequency power to form a plasma.
Figure 1B:
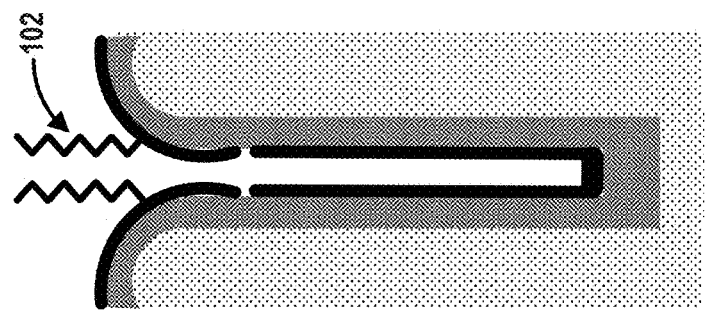

Examples of the disclosure provide methods of forming a silicon nitride layer on a surface of a substrate. Exemplary methods use a low frequency plasma during at least a treatment process of the method. It is thought that the low-frequency plasm provides ions with higher bombardment energy, which enables the ions to penetrate deeper within a recess on a substrate and/or deeper within a deposited film FIG. 1 illustrates (a) bombardment depth of ions formed using a high frequency plasma and (b) bombardment depth of ions formed using a low frequency plasma. In this context, low frequency plasma can refer to a plasma formed using a power frequency between about 300 kHz and about 500 kHz. High frequency plasma can refer to a plasma formed using a power frequency between about 13 MHz and about 14 MHz or about 26 MHz and about 28 MHz. As illustrated, the low frequency plasma produces ions that penetrate deeper within a recess 104, relative to ions produced using the high frequency within a recess 102.

Figure 2:
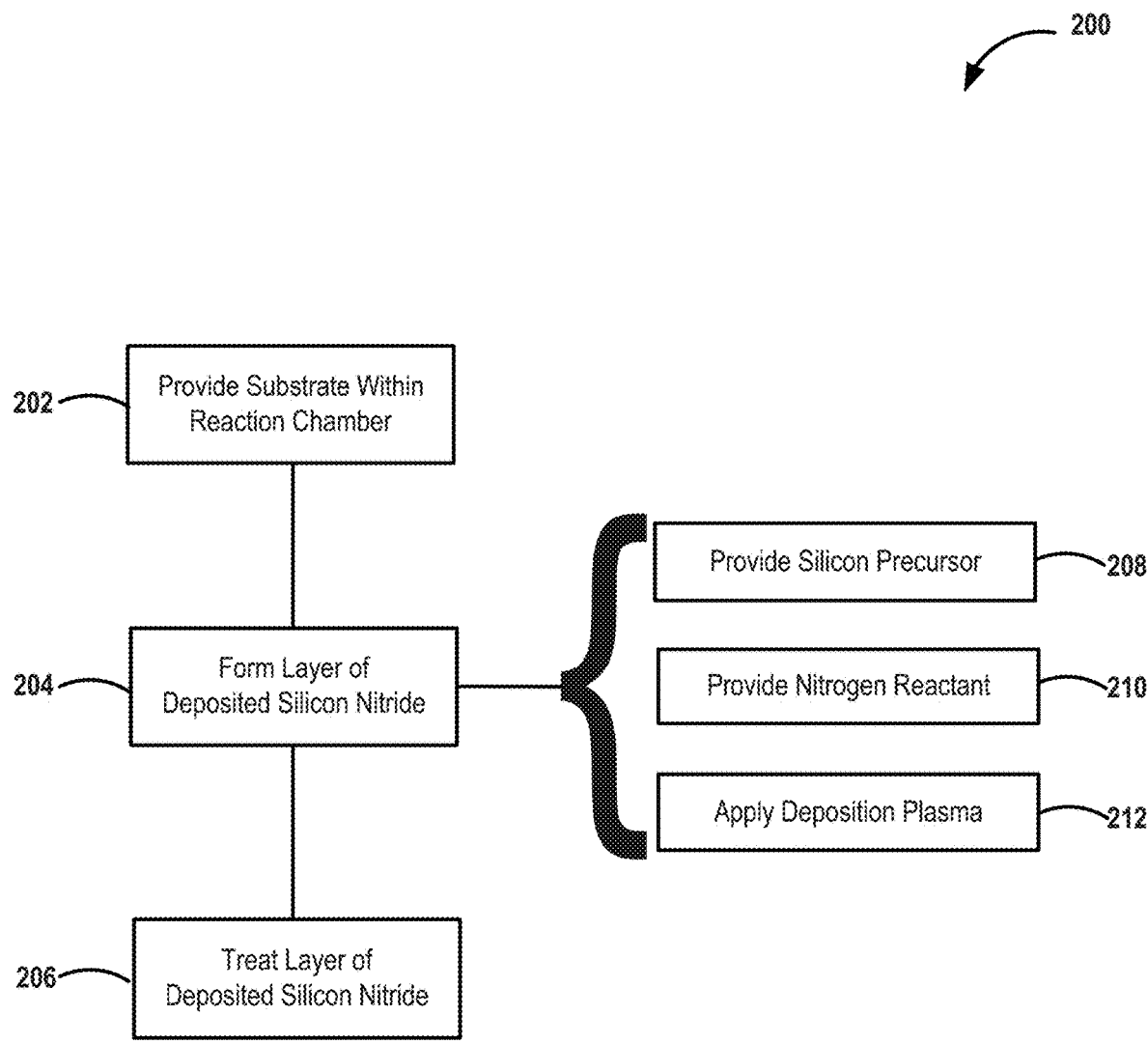
FIG. 2 illustrates a method in accordance with examples of the disclosure.

FIG. 2 illustrates a method 200 of forming a silicon nitride layer on a surface of a substrate in accordance with examples of the disclosure. Method 200 includes the steps of providing a substrate within a reaction chamber (step 202), forming a layer of deposited silicon nitride overlying the substrate (step 204), and treating the layer of deposited silicon nitride layer using a treatment plasma (step 206). As illustrated, step 204 can include substeps of providing a silicon precursor (substep 208), providing a nitrogen reactant (substep 210), and applying a deposition plasma (substep 212)

During step 202, a substrate is provided within a reaction chamber of a reactor system. In accordance with examples of the disclosure, the substrate includes a surface comprising patterned features. The patterned features can include recesses, such as trenches, vias, or areas between adjacent protrusions. A reaction chamber used during step 202 can be or include a reaction chamber of a chemical vapor deposition reactor system configured to perform a cyclical deposition process. The reaction chamber can be a standalone reaction chamber or part of a cluster tool. An exemplary suitable reaction chamber is discussed in more detail below in connection with FIG. 10.

Step 202 can include heating the substrate to a desired deposition temperature within the reaction chamber. In some embodiments of the disclosure, step 202 includes heating the substrate to a temperature of less than 800° C. For example, in some embodiments of the disclosure, heating the substrate to a deposition temperature may comprise heating the substrate to a temperature between approximately 50° C. and approximately 300° C. In addition to controlling the temperature of the substrate, a pressure within the reaction chamber may also be regulated. For example, in some embodiments of the disclosure, the pressure within the reaction chamber during step 102 may be less than 760 Torr or between 0.2 Torr and 760 Torr or about 1.5 Torr and 22.5 Torr.

During step 204, a layer of deposited silicon nitride is formed overlying the substrate provided in step 202. In accordance with examples of the disclosure, step 204 includes a cyclical plasma process, such as a PEALD process.

In the illustrated example, step 204 includes providing a silicon precursor to the reaction chamber for a silicon precursor pulse period (substep 208), providing a nitrogen reactant to the reaction chamber for a nitrogen reactant pulse period (substep 210), and applying a deposition plasma power having a first frequency for a first plasma power period to form excited species from the nitrogen reactant to form the layer of deposited silicon nitride (substep 212). The pressure and/or temperature during step 204 can be the same or similar to the temperature set forth in connection with step 202.

During substep 208, the silicon precursor is provided to the reaction chamber. Exemplary silicon precursors can be selected from the group consisting of aminosilane, halogenated silane, monosilane, and disilane as a precursor. The aminosilane and halogenated silane include, but are not limited to, $Si_2Cl_6$, $SiCl_2H_2$, $SiI_2H_2$, bisdiethylaminosilane, bisdimethylaminosilane, hexaethylaminodisilane, tetraethylaminosilane, tert-butylaminosilane, bistert-butylaminosilane, trimethylsilyldiethylamine, trimethylsilyldiethylamine, and bisdimethylaminodimethylsilane. A precursor with a carrier gas flow rate may be in a range of about 500 to about 5000 sccm. A duration of precursor pulse period 212 can range from about 0.05 to about 5 seconds. The gas comprising the carrier gas and the precursor gas can comprise about 5% to about 10% precursor.

During substep 210, a nitrogen reactant is provided to the reaction chamber for a nitrogen reactant pulse period. Exemplary nitrogen reactants include nitrogen and optionally hydrogen. By way of particular example, the nitrogen reactant can include one or more of nitrogen ($N_2$) and $NH_3$. A nitrogen reactant gas flowrate can be in a range of about 100 to about 10000 sccm. A duration of the nitrogen reactant pulse period can range from about 0.05 to about 5 seconds.

During substep 212, a deposition plasma power having a first frequency for a first plasma power period to form excited species from the nitrogen reactant is applied within the reaction chamber. In accordance with examples of these embodiments, the first frequency can be between about 13 MHz and about 14 MHz or about 26 MHz and about 28 MHz. In these cases, the first frequency is higher than the second frequency. In accordance with other examples of the disclosure, the first frequency and the second frequency are about the same (e.g., within about 10 percent of each other). In these cases, the first can be between about 300 kHz and about 500 kHz. A power for the plasma can be, for example, between about 100 W and about 1000 W or between about 400 W and about 800 W.

In some cases, method 200 can also include providing a hydrogen reactant to the reaction chamber for a hydrogen reactant pulse period (e.g., during the step of forming the layer of deposited silicon nitride). Exemplary hydrogen reactants include hydrogen ($H_2$) and hydrocarbons, such as, for example, methane.

Steps 208-212 can be repeated a number of times prior to method 200 proceeding to step 206. In addition, steps 204 and 206 can be repeated a number of times to form the silicon nitride layer.

Step 206 includes treating the layer of deposited silicon nitride layer using a treatment plasma having a treatment plasma power having second frequency for a treatment plasma power period. In accordance with various examples of the disclosure, the second frequency can be the same or less than the first frequency. For example, the second frequency can be between about 300 kHz and about 500 kHz. In some cases, two plasma power frequencies (the second frequency and a third frequency) can be used during step 206. In these cases, the third frequency can be about the same (e.g., within about ten percent) and/or can be in the ranges indicated above for the first frequency. A duration of the treatment plasma power period can be between about 0.5 and about 60 seconds. A power for the plasma during step 206 can be, for example, between about 100 W and about 1000 W or between about 400 W and about 800 W.

As used herein, pulse period means a period in which a gas (e.g., precursor, reactant, inert gas, and/or carrier gas) is flowed to a reaction chamber and/or a period in which power is applied (e.g., power to produce a plasma). A height and/or width of the illustrated pulse period is not necessarily indicative of a particular amount or duration of a pulse.

FIG. 3 illustrates an exemplary timing sequence 300 suitable for steps 204 and 206 in accordance with examples of the disclosure. Timing sequence 300 may be particularly useful for methods of forming a silicon nitride layer on a surface of a substrate to fill a gap on the surface.

In the illustrated example, a silicon precursor is provided to the reaction chamber for a silicon precursor pulse period 302, a nitrogen reactant is provided to the reaction chamber for a nitrogen reactant pulse period 304, optionally, a hydrogen reactant is provided to the reaction chamber for one or more hydrogen reactant pulse periods 306, 306', a deposition plasma power having a first frequency is applied for a first plasma power period 308, and treatment plasma power having second frequency is applied for a treatment plasma power period 310. In accordance with examples of the disclosure, pulse periods 308 and 310 do not overlap in time or space.

Silicon precursor pulse period 302 can be the same or similar to substep 208, nitrogen reactant pulse period 304 can be the same or similar to substep 210, hydrogen reactant pulse period 306 can be as described above, a first plasma power period 308 can be the same or similar to substep 212, and treatment plasma power period 310 can be as described above in connection with step 206.

In addition to pulse periods 302-310, timing sequence can include a source purge step 312 and/or a post treatment purge 314. During source purge step 312, a carrier gas (e.g., used to provide a silicon precursor during silicon precursor pulse period 302), a nitrogen reactant, and/or a hydrogen reactant can be provided to the reaction chamber to facilitate distribution and/or removal of some of the silicon precursor provided during silicon precursor pulse period 302 and/or byproducts thereof. During post treatment purge step 314, a carrier gas, a nitrogen reactant, and/or a hydrogen reactant can be provided to the reaction chamber to facilitate removal gases from the reaction chamber.

In accordance with the illustrated examples, silicon precursor pulse period 302 does not overlap with source purge step 312, post treatment purge 314, first plasma power period 308, or treatment plasma power period 310. Further, neither of hydrogen reactant pulse periods 306, 306' overlap with treatment plasma power period 310. Nitrogen reactant pulse period 304 can be continuous through at least one combination of forming the layer of deposited silicon nitride and treating the layer of deposited silicon nitride.

FIG. 4 illustrates another timing sequence 400 suitable for steps 204 and 206 in accordance with additional examples of the disclosure. Timing sequence 400 may be particularly useful for methods of forming a silicon nitride layer on a sidewall of a feature on a surface on a substrate. The silicon nitride layer can be used for, for example, a liner.

Similar to timing sequence 200, timing sequence 400 include a silicon precursor pulse period 402, a nitrogen reactant pulse period 404, optionally, one or more hydrogen reactant pulse periods 406, 406', a first plasma power period 408, and a treatment plasma power period 410, which can be the same or similar to 302-310. Further, timing sequence 400 includes a source purge step 412, a post deposition purge step 414, a hydrogen purge step 416, and a post treatment purge/hydrogen in step 418. Steps 412 and 418 can be the same or similar to steps 312, 314, respectively. Post deposition purge step 414 can include providing the nitrogen reactant and/or the hydrogen reactant to the reaction chamber. Hydrogen purge step 416 can include providing the nitrogen reactant to the reaction chamber, while the hydrogen reactant is not provided to the reaction chamber.

Although not separately illustrated, one or more carrier gases can be supplied to the reaction chamber during one or more (e.g., all) of steps 302-314, 402-418. The carrier gas can be or include an inert gas, nitrogen, or the like.

FIG. 5 illustrates scanning transmission electron microscopy (STEM) images of structures 502, 512, 522, and 532. Structure 502 includes a substrate 504, having features 506 formed thereon. A silicon nitride layer 508 is formed overlying substrate 504 and features 506. Structure 502 was formed in accordance with method 200, but without a treating the layer of deposited silicon nitride step 206. Structure 512 includes a substrate 514, having features 516 formed thereon. A silicon nitride layer 518 is formed overlying substrate 514 and features 516. Structure 512 was formed in accordance with method 200, including a treating the layer of deposited silicon nitride step 206. Structure 522 illustrates structure 502 after exposure to an etch process (e.g., a dilute hydrofluoric acid (HF) etch. As illustrated, a portion of silicon nitride layer 508 is removed, with silicon nitride layer 510 remaining after the etch process. Structure 532 illustrates structure 512 after exposure to the etch process. A portion of silicon nitride layer 518 is removed, with silicon nitride layer 520 remaining after the etch process. Silicon nitride layers 518 exhibited better quality—e.g., lower and more consistent etch rates, particularly on sidewall 524—compared to silicon nitride layer 508 on sidewall 526.

FIG. 6 illustrates a structures 602, formed using method 200 with a high-frequency plasma treatment process, and a structure 604, formed using a low-frequency plasma treatment process. Structure 602 includes substrate 606 and silicon nitride layer 608. Structure 604 includes substrate 610 and silicon nitride layer 612.

FIG. 7 illustrates a thickness ratio (measured thickness at a location/measured thickness at an opening of the feature) vs. depth from the opening of the feature for structure 602 (line 702) and structure 604 (line 704). As illustrated in FIG. 7, a normalized thickness of silicon nitride layer 612 is consistently greater on a sidewall 618 of a trench 616, compared to a normalized thickness of silicon nitride layer 608 on a sidewall 620 of a trench 614, illustrating that silicon nitride layers deposited using method 200 using a low-frequency treatment process had better gap fill than silicon nitride layers deposited using method 200 using a high-frequency treatment process.

FIG. 8 illustrates a structures 802, formed using method 200 with a high-frequency plasma treatment process, and a structure 804, formed using a high frequency and a low-frequency plasma treatment process The low and high frequencies can be applied concurrently or sequentially. Structure 802 includes substrate 806 and silicon nitride layer 810. Structure 804 includes substrate 822 and silicon nitride layer 824. A plasma treatment time to form structure 804 was less than 3 seconds and can be between about 0.5 and about 2 seconds. A plasma treatment time to form structure 802 was greater than 7 seconds. As illustrated, a shorter time can be used to form a structure when applying both a high frequency and a low frequency power during the plasma treatment process.

FIG. 9 a thickness ratio (measured thickness at a location/measured thickness at an opening of the feature) vs. depth from the opening of the feature (e.g., at locations 812-820) for structure 802 (line 902) and structure 804 (line 904). As illustrated in FIG. 9, a normalized thickness silicon nitride layer 824 is consistently greater on a sidewall 826 of a trench 828, compared to a normalized thickness of silicon nitride layer 810 on a sidewall 830 of a trench 832, illustrating that silicon nitride layers deposited using method 200 using a low-frequency+a high frequency treatment process had better gap fill than silicon nitride layers deposited using method 200 using only a high-frequency treatment process—even with the shorter plasma treatment time to form structure 804, compared to the plasma treatment time to form structure 802.

Turning now to FIG. 10, a reactor system 1000 in accordance with exemplary embodiments of the disclosure is illustrated. Reactor system 1000 can be used to perform one or more steps or substeps as described herein and/or to form one or more device structures or portions thereof as described herein.

Reactor system 1000 includes a pair of electrically conductive flat-plate electrodes 1014, 1018 in parallel and facing each other in an interior 1001 (reaction zone) of a reaction chamber 1002. Although illustrated with one reaction chamber 1002, system 1000 can include two or more reaction chambers. A plasma can be excited within reaction chamber 1001 by applying, for example, high frequency (HRF), low frequency (LRF) or LRF+HRF power from plasma power source(s) 1008 to one electrode (e.g., electrode 1018) and electrically grounding the other electrode (e.g., electrode 1014). A temperature regulator 1003 can be provided in a lower stage 1014 (the lower electrode), and a temperature of a substrate 1022 placed thereon can be kept at a desired temperature, such as the temperatures noted above. Electrode 1018 can serve as a gas distribution device, such as a shower plate or showerhead. Precursor gases, reactant gases, and a carrier or inert gas, if any, or the like can be introduced into reaction chamber 1002 using one or more gas lines (e.g., reactant gas line 1004 and precursor gas line 1006, respectively, coupled to a reactant source and a precursor source). For example, an inert gas and a reactant (e.g., as described above) can be introduced into reaction chamber 1002 using line 1004 and/or a precursor and a carrier gas (e.g., as described above) can be introduced into the reaction chamber using line 1006. Although illustrated with two inlet gas lines 1004, 1006, reactor system 1000 can include any suitable number of gas lines.

In reaction chamber 1002, a circular duct 1020 with an exhaust line 1021 can be provided, through which gas in the interior 1001 of the reaction chamber 1002 can be exhausted to an exhaust source 1010. Additionally, a transfer chamber 1023 can be provided with a seal gas line 1029 to introduce seal gas into the interior 1001 of reaction chamber 1002 via the interior (transfer zone) of transfer chamber 1023, wherein a separation plate 1025 for separating the reaction zone and the transfer chamber 1023 can be provided (a gate valve through which a substrate is transferred into or from transfer chamber 1023 is omitted from this figure). Transfer chamber 1023 can also be provided with an exhaust line 1027 coupled to an exhaust source 1010. In some embodiments, continuous flow of a carrier gas to reaction chamber 1002 can be accomplished using a flow-pass system (FPS).

Reactor system 1000 can include one or more controller(s) 1012 programmed or otherwise configured to cause one or more method steps as described herein to be conducted. Controller(s) 1012 are coupled with the various power sources, heating systems, pumps, robotics and gas flow controllers, or valves of the reactor, as will be appreciated by the skilled artisan. By way of example, controller 1012 can be configured to control gas flow of a precursor, a reactant, and an inert gas into at least one of the one or more reaction chambers to form a silicon nitride layer on a surface of a substrate. Controller 1012 can be further configured to provide power (e.g., HRF, LRF or LRF+HRF) to form a plasma—e.g., within reaction chamber 1002. Controller 1012 can be similarly configured to perform additional steps as described herein. By way of examples, controller 1012 can be configured to control gas flow of a precursor and a reactant into at least one of the one or more reaction chambers to form a treated silicon nitride layer overlying a substrate and to provide a deposition plasma power and a treatment plasma power within the at least one reaction chamber, wherein a frequency of the deposition power can be different than a frequency of the treatment plasma power.

Controller 1012 can include electronic circuitry and software to selectively operate valves, manifolds, heaters, pumps and other components included in system 1000. Such circuitry and components operate to introduce precursors, reactants, and purge gases from the respective sources. Controller 1012 can control timing of gas pulse sequences, temperature of the substrate and/or reaction chamber, pressure within the reaction chamber, plasma power, and various other operations to provide proper operation of the system 1000, such as in the performance of method 200 or timing sequence 300 or 400.

Controller 1012 can include control software to electrically or pneumatically control valves to control flow of precursors, reactants, and/or purge gases into and out of the reaction chamber 1002. Controller 1012 can include modules such as a software or hardware component, e.g., a FPGA or ASIC, which performs certain tasks. A module can advantageously be configured to reside on the addressable storage medium of the control system and be configured to execute one or more processes.

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

During operation of system 1000, substrates, such as semiconductor wafers, are transferred from, e.g., a substrate handling area 1023 to the reaction zone 1001. Once substrate (s) are transferred to reaction zone 1001, one or more gases, such as precursors, reactants, carrier gases, and/or purge gases, are introduced into reaction chamber 1002.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

What is claimed is:

1. A method of forming a silicon nitride layer on a surface of a substrate, the method comprising the steps of:
    providing the substrate within a reaction chamber;
    forming a layer of deposited silicon nitride overlying the substrate, wherein the step of forming the layer of deposited silicon nitride layer comprises:
        providing a silicon precursor to the reaction chamber for a silicon precursor pulse period;
        providing a nitrogen reactant to the reaction chamber for a nitrogen reactant pulse period; and
        applying a deposition plasma power having a first frequency for a first plasma power period to form excited species from the nitrogen reactant to form the layer of deposited silicon nitride; and
    treating the layer of deposited silicon nitride layer using a treatment plasma having a treatment plasma power having second frequency for a treatment plasma power period,
    wherein the nitrogen reactant is provided to the reaction chamber during forming the layer of deposited silicon nitride and treating the layer of deposited silicon nitride.

2. The method of claim 1, wherein the first frequency and the second frequency are about the same.

3. The method of claim 1, wherein the first frequency is higher than the second frequency.

4. The method of claim 1, wherein the first frequency is between about 13 MHz and about 14 MHz or about 26 MHz and about 28 MHz.

5. The method of claim 1, wherein the second frequency is between about 300 kHz and about 500 kHz.

6. The method of claim 1, wherein forming the layer of deposited silicon nitride further comprises repeating the steps of providing the silicon precursor, providing the nitrogen reactant, and applying the deposition plasma power one or more times, and wherein treating the layer of deposited silicon nitride layer is performed after forming the layer of deposited silicon nitride.

7. The method of claim 6, wherein forming the layer of deposited silicon nitride and treating the layer of deposited silicon nitride layer are repeated one or more times.

8. The method of claim 1, wherein the silicon precursor pulse period and one or more of the first plasma power period and the second plasma power period do not overlap.

9. The method of claim 1, further comprising a step of providing a hydrogen reactant to the reaction chamber, wherein the hydrogen reactant comprises hydrogen ($H_2$) or a hydrocarbon.

10. The method of claim 9, wherein the hydrogen reactant is continuously provided to the reaction chamber during the step of forming the layer of deposited silicon nitride.

11. The method of claim 9, wherein the hydrogen reactant is not provided to the reaction chamber during the step of treating the layer of deposited silicon nitride layer.

12. The method of claim 9, wherein the hydrogen reactant comprises hydrogen ($H_2$).

13. The method of claim 1, wherein the substrate is heated to a temperature between about 50° C. and about 300° C. during forming the layer of deposited silicon nitride.

14. The method of claim 1, wherein the silicon nitride layer fills a recess formed on a surface of the substrate.

15. The method of claim 1, wherein the silicon precursor comprises one or more of an aminosilane, a halogenated silane, monosilane, and disilane.

16. The method of claim 1, wherein the nitrogen reactant comprises one or more of nitrogen ($N_2$) and $NH_3$.

17. The method of claim 1, wherein the first plasma power period and the second plasma power period do not overlap in time or in space.

18. The method of claim 1, wherein the step of treating the layer of deposited silicon nitride layer comprises using the treatment plasma power having the second frequency and a third frequency.

19. The method of claim 18, wherein the first frequency and the third frequency are about the same.

20. A system comprising:
a reaction chamber;
a silicon precursor source line;
a reactant source line;
a plasma power source having a first frequency and a second frequency;
an exhaust source; and
a controller,
wherein the controller is configured to:
    control gas flow of a silicon precursor and a nitrogen reactant into the reaction chamber;
    apply a deposition plasma power having the first frequency for a first plasma power period to form excited species from the nitrogen reactant; and
    apply a treatment plasma having a treatment plasma power and the second frequency for a second plasma power period, wherein the nitrogen reactant flows into the reaction chamber during the steps of applying the deposition plasma power and applying the treatment plasma power.

* * * * *